(12) United States Patent
Jacob et al.

(10) Patent No.: US 6,724,026 B2
(45) Date of Patent: Apr. 20, 2004

(54) MEMORY ARCHITECTURE WITH MEMORY CELL GROUPS

(75) Inventors: Michael Jacob, Kanagawa (JP); Andreas Hilliger, Kanagawa (JP); Thomas Roehr, Kanagawa (JP); Susumo Shuto, Tokyo (JP); Toru Ozaki, Tokyo (JP)

(73) Assignees: Infineon Technologies Aktiengesellschaft, Munich (DE); Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/065,123

(22) Filed: Sep. 19, 2002

(65) Prior Publication Data

US 2004/0056286 A1 Mar. 25, 2004

(51) Int. Cl.$^7$ .............................................. H01L 29/76
(52) U.S. Cl. ...................... 257/295; 257/71; 257/296; 257/298; 438/3
(58) Field of Search ................ 257/295–314, 257/68, 71, 324–326, 905–908; 438/3, 241, 258, 266, 238, 239, 386, 399, 250, 216, 393, 243, 242, 591, 593

(56) References Cited

U.S. PATENT DOCUMENTS

| | | | |
|---|---|---|---|
| 5,936,272 A | * | 8/1999 | Lee .............................. 257/306 |
| 6,500,677 B2 | * | 12/2002 | Bergmann et al. ............. 438/3 |
| 6,521,929 B2 | * | 2/2003 | Ozaki ......................... 257/295 |

* cited by examiner

*Primary Examiner*—David Nelms
*Assistant Examiner*—Andy Huynh
(74) *Attorney, Agent, or Firm*—Horizon IP Pte Ltd

(57) ABSTRACT

An improved cell design for series memory architecture is disclosed. The improved cell design facilitates the formation of capacitors using a single etch process instead of two, as conventionally required. In one embodiment, each capacitor of a capacitor pair is provided with at least one plug contacting a common diffusion region of two adjacent cell transistors. In another embodiment, a large plug with sufficient overlap to the bottom electrodes of pair of capacitors is used.

13 Claims, 8 Drawing Sheets

MEMORY ARCHITECTURE WITH MEMORY CELL GROUPS

BACKGROUND OF INVENTION

Ferroelectric metal oxide ceramic materials such as lead zirconate titanate (PZT) have been investigated for use in ferroelectric semiconductor memory devices. The ferroelectric material is located between two electrodes to form a ferroelectric capacitor for storage of information. Ferroelectric capacitor uses the hysteresis polarization characteristic of the ferroelectric material for storing information. The logic value stored in a ferroelectric memory cell depends on the polarization direction of the ferroelectric capacitor. To change the polarization direction of the capacitor, a voltage which is greater than the switching voltage (coercive voltage) needs to be applied across its electrodes. The polarization of the capacitor depends on the polarity of the voltage applied. An advantage of the ferroelectric capacitor is that it retains its polarization state after power is removed, resulting in a non-volatile memory cell.

Referring to FIG. 1, a plurality of memory cells 105 are shown. The memory cells, each with a transistor 130 coupled to a capacitor 140 in parallel, are coupled in series to form a group 102. Series memory architectures are described in, for example, Takashima et al., "High Density Chain Ferroelectric Random Access Memory (chain FRAM)". IEEEJrnl. of Solid State Circuits, vol.33, pp.787–792, May 1998, which is herein incorporated by reference for all purposes. The gates of the cell transistors can be gate conductors which are coupled to or serve as wordlines. A selection transistor 138 is provided to selectively couple one end 109 of the group to a bitline 150. A plateline 180 is coupled to the other end 108 of the group. Numerous groups are interconnected via wordlines to form a memory block. Sense amplifiers are coupled to the bitlines to facilitate access to the memory cells.

FIG. 2 shows a conventional cross-section of a memory group 202. The transistors 230 of the memory cells 205 are formed on a substrate 210. Adjacent cell transistors shared a common diffusion region. The capacitors 240 of the memory group are arranged into pairs. The capacitors of a capacitor pair share a common bottom electrode 241. The bottom electrodes are coupled to the cell transistors via active area bottom electrode (AABE) plugs 285. The top electrode 242 of a capacitor from a capacitor pair is coupled to the top electrode of a capacitor of an adjacent pair and cell transistors. The top capacitor electrodes are coupled to the cell transistors via active area top electrode (AATE) plugs 286. Between the electrodes is a ferroelectric layer 243. A barrier layer 263, such as iridium, is located between the electrode and the AABE plug. At a first end 209 of the group is a selection transistor (not shown) having one diffusion region coupled to a bitline. The other diffusion region is a common diffusion region with the cell transistor on the end of the group. A plateline is coupled to a second end 208 of the group.

Conventionally, the formation of the capacitors requires two etch steps. Specifically, the barrier and bottom electrode layers are deposited and patterned to provide a common bottom electrode for each capacitor pair. Then the ferroelectric and top electrode layers are deposited and patterned, completing the processing of the capacitors. The need for two process steps to form the capacitors undesirably increases process complexity, costs, and raw process time. Furthermore, an overetch is performed to ensure that the ferroelectric layer is completely patterned. This overetch may result in the thinning of the barrier layer in regions 274 between the capacitors of a capacitor pair. This may compromise the barrier layer, resulting in the AABE plugs 285 located below region 274 being oxidized. Also, conventional techniques for forming the capacitors in a series architecture requires the bottom electrode to overlap the top electrodes. This undesirably increases cell size (e.g., area penalty).

From the foregoing discussion, it is desirable to provide an improved memory group which avoids the disadvantages of conventional series memory architectures.

SUMMARY OF INVENTION

The invention relates to memory cells configured in a series architecture. The memory group includes at least one pair of memory cells. A memory cell comprises a capacitor having a dielectric layer between first and second electrodes and a cell transistor with first and second diffusion region, wherein the second diffusion regions of the cell transistor is a common diffusion region shared between the cell transistors of the memory cell pair.

The bottom electrodes of the pair of capacitors are coupled to the second diffusion region. In one embodiment, a bottom electrode plug is provided for each capacitor, coupling the bottom electrode to the second diffusion region. Top electrodes are coupled to first diffusion region of the respective cell transistor. In one embodiment, the memory cells are ferroelectric memory cells having a ferroelectric layer between first and second electrodes.

DETAILED DESCRIPTION

Figure 1:
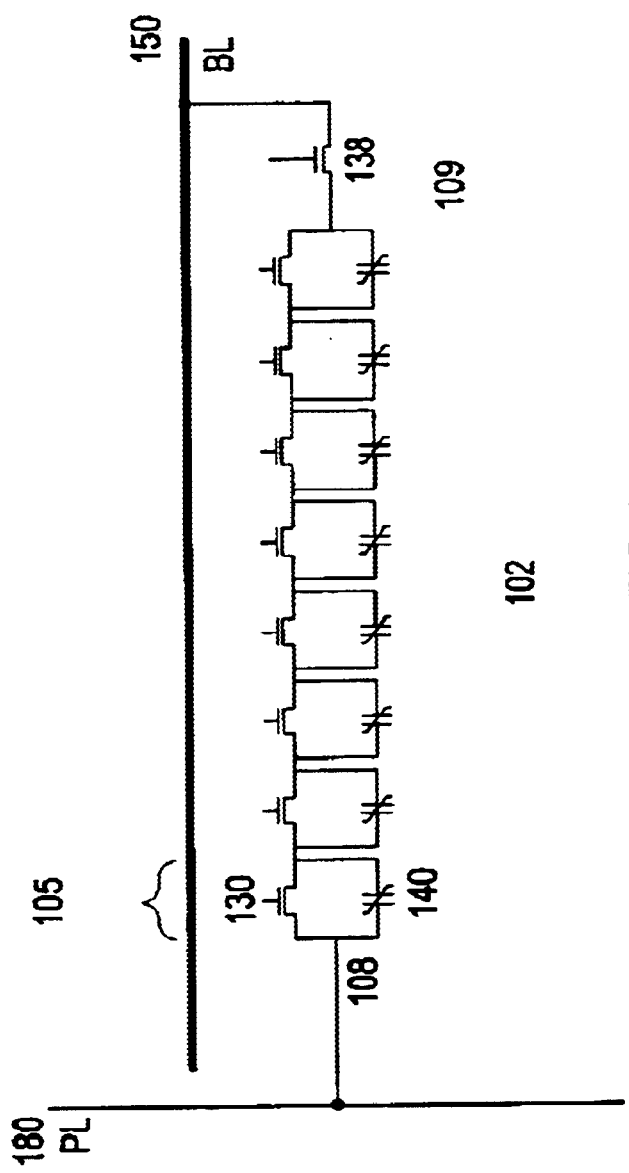
FIG. 1 shows a schematic diagram of a conventional ferroelectric memory group.
Figure 2:
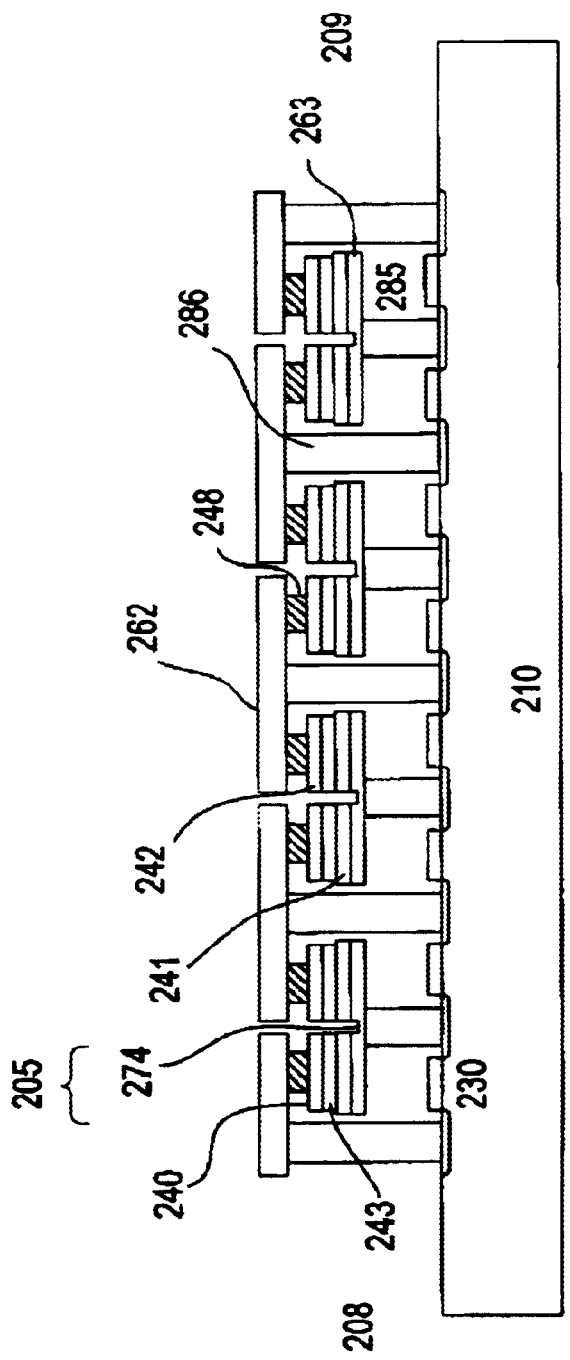
FIG. 2 shows a cross-sectional view of a conventional ferroelectric memory group.
Figure 3:
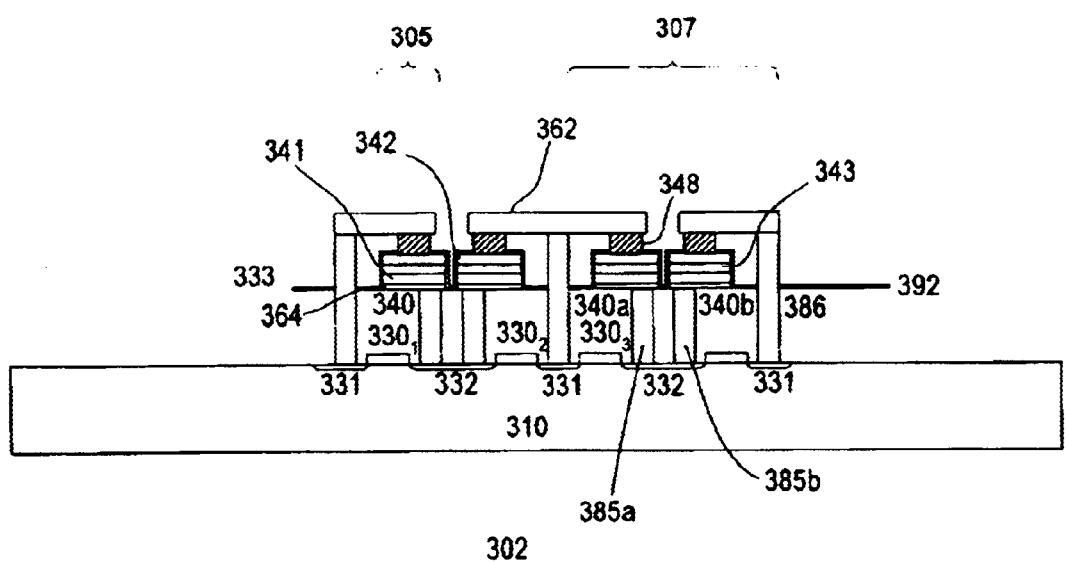
FIGS. 3–4 show cross-sectional views of a memory group in accordance various embodiments of the invention.

FIG. 3 shows a cross-section of a memory group 302 in accordance with one embodiment of the invention. The memory group includes a plurality of memory cells 305 formed on a semiconductor substrate 310 comprising, for example, silicon. Illustratively, the group includes 4 memory cells 305. It is understood that the group can comprise any number of memory cells (e.g., 2, 8 or 16). Preferably, the number of memory cells within a group is an even number. More preferably, the number of memory cells within a group is equal to $2^y$, where y is a whole number greater or equal to 1. Typically, y is from 2–5.

The memory cells each comprises a cell transistor 330 coupled to a capacitor 340. The transistors, in one embodiment, are n-FETs. P-FETs or other types of transistors can also be used. Each cell transistor includes a gate and first and second diffusion regions 331 and 332. In one embodiment, adjacent cell transistors share a common diffusion region. For a cell transistor which has two (e.g., first and second) adjacent cell transistors, both diffusion regions are shared with adjacent transistors. In one embodiment, adjacent cell transistors share either a common first or second diffusion region. As for the transistors at either end of the group ($330_1$ or $330_4$). Only their second diffusion regions are shared with adjacent transistors. For example, the first and second cell transistors $330_1$ and $330_2$ share a common second diffusion region 332 while the second and third cell transistors $330_2$ and $330_3$ share a common first diffusion region 331.

The capacitors, for example, are ferroelectric capacitors. A ferroelectric capacitor includes a ferroelectric layer 343 between first and second electrodes 341 and 342. Conductive materials, such as noble metals, (e.g., platinum) can be used to form the electrodes. Other types of conductive materials, such as conductive oxides (e.g., SRO or IrO). Can be used to form the electrodes, it is not necessary that the first and second electrodes be formed from the same type of material. The ferroelectric material, in one embodiment, comprises PZT. Strontium bismuth tantalum (SBT) or other types of ferroelectric material can also be used. Alternatively, other types of capacitors can be employed. For example, non-ferroelectric capacitors such as high k dielectric capacitors can be used.

The transistor and capacitor of a memory cell are coupled In parallel. A first or bottom electrode 341 of a capacitor is coupled one of the diffusion regions via an AABE plug 36S and a second or top electrode 342 of the capacitor is coupled the other diffusion region via an AATE plug 386. The top electrode is coupled to the AATE plug via, for example, a top electrode plug 348 and a conductive strip 362. In one embodiment, the bottom electrode is coupled to the second diffusion region while the top electrode is coupled to the first diffusion region. For two adjacent capacitors which are located on different second diffusion regions, their top electrodes are commonly coupled to a common first diffusion between the two capacitors.

In accordance with one embodiment of the invention, at least one AABE plug is associated with a capacitor. As described the AAE plug couples the bottom electrode of a capacitor to one of the diffusion regions of the cell transistor. In one embodiment, the AABE plug couples the bottom electrode of a capacitor to the second diffusion region of its respective cell transistor. Since adjacent cell transistors share a common second diffusion region, the second diffusion region is provided with at least two AABE plugs (385a and 385b) for coupling the bottom electrode of two capacitors (340a and 340b) of adjacent memory cells thereto. Preferably, the bottom electrode completely covers or overlaps the AABE plug.

In one embodiment, a barrier layer 364 is provided between the AABE plugs and bottom electrodes. The barrier layer inhibits the diffusion of oxygen which can oxidize the plug. Materials such as iridium can be used to form the barrier layer. Other types of barrier materials which inhibit diffusion of oxygen are also useful. An adhesion layer comprising, for example titanium nitride or titanium, can be provided between the barrier and ILD layer to promote adhesion.

Figure 4:
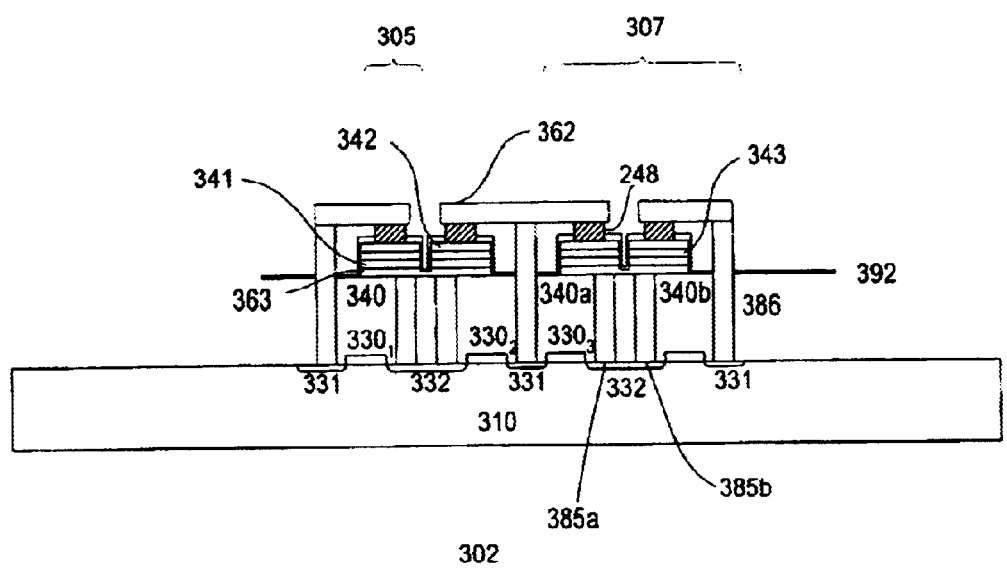

The various layers of two adjacent capacitors (e.g., barrier, electrodes and ferroelectric, in one embodiment, are completely patterned to form separate capacitors. In an alternative embodiment, as shown in FIG. 4, two adjacent capacitors coupled to the same diffusion region share a common barrier layer 363. In yet another embodiment, the bottom electrode of two adjacent capacitors coupled to the same diffusion region share a bottom electrode 341 (including the barrier layer).

In an alternative embodiment, the capacitors of a capacitor pair share a common AABE plug as in conventional series architectures. However, unlike conventional approaches, the AABE plug is relatively larger to provide sufficient overlap to both capacitors. This enables the formation of the capacitors using a one step etch approach without suffering problems associated with plug oxidation. Depending on the application, the surface of the plug may be exposed (e.g., barrier and/or bottom electrode removed). However, by providing a larger AABE plug, the electrical connection to the capacitors is provided by the overlap of the AABE plug to the bottom electrode, in a preferred embodiment, the AABE plug sufficiently overlaps the two bottom electrodes of the capacitor pair to achieve the desired electrical characteristics. Preferably, the AABE plug overlaps each of the bottom electrodes by at least 112 and more preferably between ½–⅔.

An encapsulation layer 392 can cover the capacitors to serve as a barrier against contaminants, such as hydrogen. The encapsulation layer can be formed from, for example, aluminum oxide. One end of the group is coupled to a bitline via, for example, a selection transistor. The selection transistor can advantageously share a common diffusion region with a cell transistor. The other end of the group is coupled to a plateline.

Figure 5:
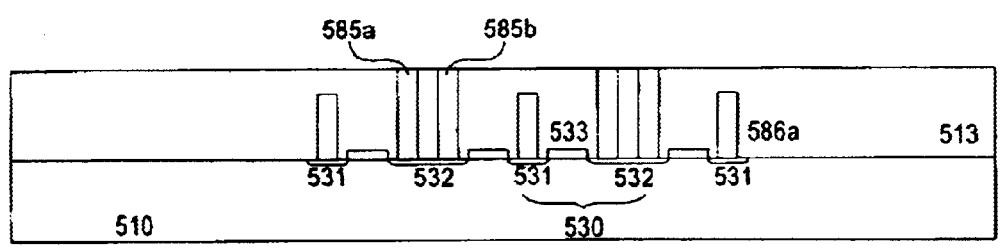
FIGS. 5–8 show a process for forming a memory group in accordance with one embodiment of the invention.

FIGS. 5–10 show a process for forming a memory group In accordance with one embodiment of the invention. Referring to FIG. 5, a semiconductor substrate 510 is provided. The substrate comprises, for example, silicon. Other types of semiconductor substrates are also useful. The substrate is prepared with cell transistors of the memory group. Other components (not shown), such as support circuitry, can also be prepared on the substrate. Illustratively, the memory group comprises 4 memory cells.

A cell transistor 530 comprises a gate 533 and first and second diffusion regions 531 and 532. In one embodiment, adjacent cell transistors share a common diffusion region (531 or 532). For transistors in the middle of the group, both diffusion regions are shared with adjacent cell transistors while the cell transistors at the end of the group each has only one shared diffusion region. The cell transistors, for example, are n-FETs. P-FETS or other types of transistors can also be used. A selection transistor (not shown) can also be provided on the substrate. The selection transistor can share a common diffusion region with a cell transistor on one end of the group.

An ILD layer 513 is provided over the substrate. The ILD, for example, comprises silicon oxide. Other types of dielectric materials, such as silicon nitride, doped or undoped silicate glass, or spin-on glass, are also useful. Various techniques can be used to form the ILD, such as chemical vapor deposition (CVD).

In one embodiment, AATE plugs are formed in two separate processes. The first process forms the lower portions 586a while the second process forms the upper portions. Forming the AATE plugs in two separate processes facilitates filling of the vias since the aspect ratio is reduced. Alternatively, the AATE plugs can be formed in a single process step, for example, after the capacitors are formed.

Lower portions of AATE plugs 586a and AABE plugs 585 are formed In the ILD layer, coupling to the diffusion regions of the cell transistors. In one embodiment, the AABE plugs are coupled to the second diffusion regions 532 while the lower portions of AATE plugs are coupled to the first diffusion regions 531. In accordance with the invention, at least one AABE plug is provided for each capacitor. This results in a common second diffusion region to Include at least two AATE plugs (585a and 585b), one for each capacitor of the two adjacent memory cells. The plugs, for example, comprise a conductive material such as poly-Si.

Other types of conductive material, such as tungsten (W), can also be used.

The plugs are formed using conventional techniques. For example, a resist layer Is deposited on the ILD layer and patterned to form openings corresponding to vias in which plugs are formed. An anisotropic etch, such as reactive ion etching (RIE), is then performed. The RIE removes portions of the ILD layer exposed by the resist mask, creating vias. A conductive material is then deposited on the substrate, filling the vias. Excess conductive material over the ILD is then removed by, for example, chemical mechanical polishing (CMP). The CMP creates a planar surface between the plugs and ILD.

A liner layer, such as titanium, can be deposited on the substrate to line the via walls prior to filling the vias. The liner layer can be used for silicidation of the substrate material to reduce contact resistance. A barrier, such as titanium nitride, can also be provided to line the via walls. The barrier layer inhibits reaction between the substrate and plug materials. Depending on whether the liner and/or barrier layers are conductive or not, the bottom of the via may be removed to expose the diffusion region.

In one embodiment, the AABE and lower portions of the AATE plugs are formed by separate processes. The height of the lower portions of the AATE plugs, in one embodiment, is lower than the height of the AABE plugs. This can be achieved by, for example, depositing a first dielectric layer followed by forming the lower portions of the AABE plugs. Thereafter, a second dielectric layer is deposited and the AABE plugs are formed. Forming the plugs separately is particularly advantageous since it allows for the different types of plugs to be optimized. Alternatively, the different types of plugs can have the same height or formed during the same process.

Figure 6:
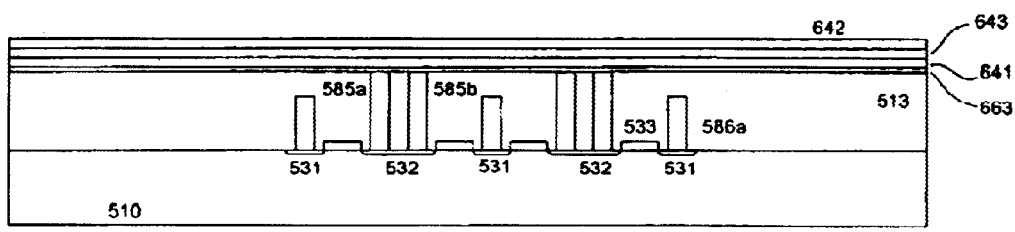

Referring to FIG. 6, a barrier layer 663 is deposited on the ILD layer. The barrier layer comprises, for example, iridium. Other materials which can inhibit the diffusion of oxygen can also be used. To promote adhesion between the barrier layer and ILD, an adhesion layer can be provided beneath the barrier layer. The adhesion layer comprises, in one embodiment, titanium. Other types of adhesion promoting materials can also be used, including non-conductive materials. For non-conductive materials, the adhesion layer can remain on the ILD except wherein the plugs are located. Various techniques, for example PVD and CVD, can be used to form the barrier and adhesion layers.

For applications where the plug comprises poly-Si, a metal silicide layer can be formed over the ILD prior to the capacitor layers. The metal silicide, for example comprises titanium or cobalt. Other metal silicides are also useful. The metal silicide can be formed by conventional techniques.

Various capacitor layers are then deposited on the substrate over the barrier layer. In one embodiment, the capacitor layers comprise layers for forming ferroelectric capacitors. For example, first electrode 641, ferroelectrtc layer 643 and second electrode 642 are sequentially deposited on the substrate. In one embodiment, the electrode material comprises a noble metal such as platinum and the ferroelectric material comprises lead zirconate titanate (PZT). Other conductive and ferroelectric materials can also be used. The first and second electrodes could also be formed from different conductive materials. In alternative embodiments, the various capacitor layers are used to form non-ferroelectric capacitors such as dynamic random access memory (DRAM) capacitors. Conventional techniques, such as CVD, MOCVD, PVD, and spin-on, can be used to form the various capacitor layers.

Figure 7:
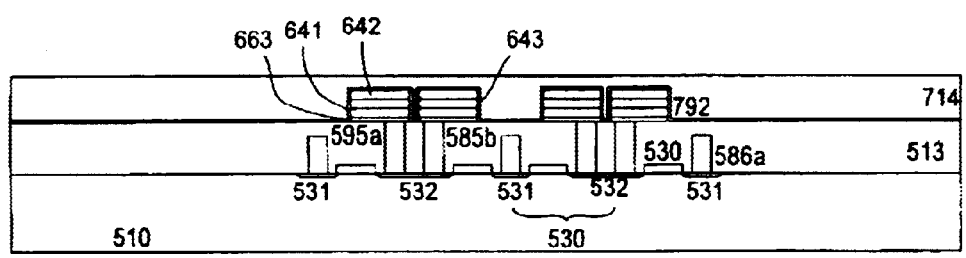

Referring to FIG. 7, the various capacitor layers (including the barrier layer) are patterned to form the capacitors over the AABE plugs. For applications employing a conductive adhesion layer, they are also patterned with the capacitors. Conventional mask and etch techniques can be used to pattern the layers. For example, a hard mask is deposited on the top capacitor layer The hard mask, in one embodiment, comprises $SiO_2$. Other hard mask material is also useful. A photoresist layer is deposited on the hard mask layer. An antireflective (ARC) layer can be formed beneath the photoresist. The photoresist layer is patterned, leaving a resist block to protect the hard mask layer in regions corresponding to the area of the capacitor. An anisotopic etch, such as an RIE, is used to remove the exposed portions of the hard mask layer to expose the top capacitor layer. The resist is removed after the hard mask is patterned. An RIE is then performed to remove the layers to form the capacitors.

In an alternative embodiment, the capacitor can be formed using a two step process. For example, the barrier layer and bottom electrode can be patterned first to form lower portions of the capacitors, followed by formation of the upper portion of the capacitor by depositing and patterning the dielectric and top electrode layers. An over etch is performed to ensure the ferroelectric layer is patterned. In yet another embodiment of the invention, the barrier layer is first patterned while the other capacitor layers are patterned together in a separate process.

By providing each capacitor with its own AABE plug, the capacitors can be formed in a single patterning step. This is advantageous since process complexity is reduced. Furthermore, by aligning the AABE plug beneath the capacitor, the adverse effects from thinning of the barrier layer resulting from patterning of the capacitors are avoided.

After the capacitors are formed, an encapsulation layer 792 is deposited on the substrate. The encapsulation layer covers the capacitors and ILD layer. In one embodiment the encapsulation layer comprises $Al_3O_2$. Other types of materials which are good insulators and having good barrier properties, such as SiN or $TlO_2$, are also useful. A dielectric layer 714 is deposited on the substrate covering the capacitors.

Figure 8:
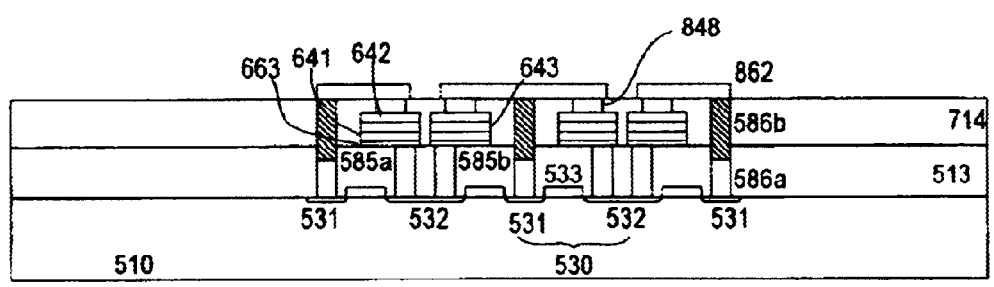

Referring to FIG. 8, the process continues to form interconnections between the top electrodes and AATE plugs. In one embodiment, TE plugs 848 and upper portions 586b of the AATE plugs are formed in the ILD layer. The TE and upper portions of the AATE plugs, for example, are formed using separate processes. Forming the plugs in the same process can also be useful. After the plugs are formed, a conductive layer is deposited and pattern to form conductive strips to couple the TE plugs to the AATE plugs. The conductive layer, in one embodiment, comprises aluminum. Other conductive materials, such as tungsten, TiN, Ti, or Cu, are also useful.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. An integrated circuit comprising:
   at least one memory cell pair having first and second memory cells arranged in a memory group, a memory cell includes a cell transistor having first and second diffusion regions and a cell capacitor having a dielectric layer between first and second electrodes, wherein the cell transistors of the memory cell pair share a common second diffusion region;

a first bottom electrode plug coupling the first electrode of first memory cell capacitor to the common second diffusion region;

a second bottom electrode plug coupling the first electrode of the second memory cell capacitor to the common second diffusion region; and the second electrode of the first memory cell capacitor is coupled to the first diffusion region of the first memory cell transistor and the second electrode of the second memory cell capacitor is coupled to the first diffusion region of the second cell transistor.

2. The integrated circuit of claim 1 wherein the memory cells are ferroelectric memory cells.

3. The integrated circuit of claim 2 wherein the memory group comprises $2^y$ memory cells, where y is equal to a whole number greater or equal 1.

4. The integrated circuit of claim 2 further comprises at least 1 additional memory cell pair, wherein adjacent cell transistors of two adjacent memory cell pairs shares a common first diffusion region and second electrodes of capacitors of adjacent memory cell pairs are commonly coupled to the common first diffusion region.

5. The integrated circuit of claim 4 wherein the memory group comprises $2^y$ memory cells, where y is equal to a whole number greater or equal to 1.

6. The integrated circuit of claim 1 further comprises at least 1 additional memory cell pair, wherein adjacent cell transistors of two adjacent memory cell pairs share a common first diffusion region and second electrodes of capacitors of adjacent memory cell pairs are commonly coupled to the common first diffusion region.

7. The integrated circuit of claim 6 wherein the memory group comprises $2^y$ memory cells, where y is equal to a whole number greater or equal to 1.

8. The integrated circuit of claim 1 wherein the memory group comprises $2^y$ memory cells, where y is equal to a whole number greater or equal to 1.

9. The integrated circuit of claim 1, 2, 4 or 6 wherein the cell capacitor further comprises a barrier layer between the first electrode and bottom electrode plug.

10. The integrated circuit of claim 9 wherein the capacitors of the memory cells are formed in a single etch step.

11. The integrated circuit of claim 10 wherein the cell capacitor of one memory cell pair share a common first electrode.

12. The integrated circuit of claim 10 wherein the cell capacitors of one memory cell pair share a common barrier layer.

13. The integrated circuit of claim 12 wherein the cell capacitor of one memory cell pair share a common first electrode.

* * * * *